(12) United States Patent
Ogawa

(10) Patent No.: US 6,188,246 B1
(45) Date of Patent: Feb. 13, 2001

(54) SEMICONDUCTOR CIRCUIT WITH SEQUENTIAL CIRCUIT WHICH CAN PREVENT LEAKAGE CURRENT

(75) Inventor: Tadahiko Ogawa, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/310,859

(22) Filed: May 13, 1999

(30) Foreign Application Priority Data

May 20, 1998 (JP) ................................................ 10-138856

(51) Int. Cl.[7] .............................................. H03K 19/0175
(52) U.S. Cl. ................................................. 326/86; 326/34
(58) Field of Search .............................. 326/86, 34, 121; 327/534, 537, 333

(56) References Cited

U.S. PATENT DOCUMENTS

| | | | |
|---|---|---|---|
| 4,691,189 | 9/1987 | Dingwell et al. | 326/92 |
| 5,525,921 | 6/1996 | Callahan | 327/202 |
| 5,552,738 | 9/1996 | Ko | 327/203 |
| 5,821,769 | 10/1998 | Douseki | 326/34 |

FOREIGN PATENT DOCUMENTS

| | | |
|---|---|---|
| 5-54693 | 3/1993 | (JP) . |
| 5-122020 | 5/1993 | (JP) . |
| 5-122021 | 5/1993 | (JP) . |
| 6-29834 | 2/1994 | (JP) . |
| 7-202647 | 8/1995 | (JP) . |
| 2631335 | 4/1997 | (JP) . |
| 9-121152 | 5/1997 | (JP) . |
| 9-274797 | 10/1997 | (JP) . |

*Primary Examiner*—David Nelms
*Assistant Examiner*—Thong Le
(74) *Attorney, Agent, or Firm*—Sughrue, Mion, Zinn, Macpeak & Seas, PLLC

(57) ABSTRACT

A semiconductor circuit includes a logic circuit section and a latch circuit section. The logic circuit section includes higher and lower potential side actual power supply lines, higher and lower potential side quasi power supply lines, a CMOS logic circuit and a power connection section. The latch circuit section includes a first CMOS inverter, a latch circuit and a transfer gate. The first CMOS inverter is connected between the higher and lower potential side quasi power supply lines. The latch circuit is operatively and selectively connected to the first CMOS inverter in series and is composed of second and third CMOS inverters connected in series. The transfer gate has the second threshold voltage and is disposed between the first CMOS inverter and the latch circuit.

32 Claims, 12 Drawing Sheets

SEMICONDUCTOR CIRCUIT WITH SEQUENTIAL CIRCUIT WHICH CAN PREVENT LEAKAGE CURRENT

BACKGROUND OF THE INVENTION

1. Field of the Invention

The present invention relates to a sequential circuit which has a function of holding data in a sleep mode.

2. Description of the Related Art

Semiconductor integrated logic circuits are commonly provided with a system including a transistor circuit which makes a high speed operation in an active mode and low power consumption in a sleep mode possible. In particular, the system has a data holding function for protecting stored data in a sequential circuit from being destroyed during a sleep mode. For example, in Japanese Patent No. 2631335 is disclosed the technique of making a high speed operation possible and of supplying electric power via transistors with higher threshold voltages to shut off a leakage current in the sleep mode. Especially, the technique of a sequence circuit is disclosed in which the electric power is directly supplied and a bi-directional circuit composed of higher threshold voltage transistors is added to shut off the leakage current in the sleep mode and to simultaneously protect stored data from being destroyed.

FIG. 1 is a circuit diagram illustrating a conventional semiconductor integrated logic circuit including a sequential circuit, which has a function of holding data in the sleep mode. As shown in FIG. 1, a control transistor HP1I of a p-channel MOSFET of a higher threshold voltage is connected at its source electrode to a higher potential side actual power supply line VDD and at its drain electrode to a higher potential side quasi power supply line VDDV. In response to a sleep mode switching signal SL received at its gate electrode, the control transistor HP1I electrically connects or disconnects the higher potential side actual power supply line to and from the quasi power supply line. Also, another control transistor HN1I of an n-channel MOSFET of a higher threshold voltage is connected at its source electrode to a low potential side actual power supply line GND and at its drain electrode with a lower potential side quasi power supply line GNDV. In response to an inverted sleep mode switching signal SLB received at its gate electrode, the control transistor HN1I electrically connects or disconnects the lower potential side actual power supply line to and from the quasi power supply line. The inverted sleep mode switching signal SLB is a signal obtained by inverting the sleep mode switching signal SL. The sleep mode switching signal SL and inverted sleep mode switching signal SLB are supplied from a sleep mode control circuit (not shown).

A CMOS circuit section composed of lower threshold voltage transistors includes inverter circuits INV1I and INV2I. More particularly, each of the inverter circuits INV1I and INV2I is composed of a p-channel MOSFET of a lower threshold voltage and an n-channel MOSFET of a lower threshold voltage. The gate electrodes of the two transistors are connected to each other as a common input terminal and the drain electrodes of the same are connected to each other as a common output terminal. The source electrodes of the lower threshold voltage p-channel MOSFETs in the inverter circuits INV1I and INV2I are connected to the higher potential side quasi power supply line VDDV. The source electrodes of the lower threshold voltage n-channel MOSFETs in the inverter circuits INV1I and INV2I are connected to the lower potential side quasi power supply line GNDV.

A latch circuit 10 shown in FIG. 1 will be now explained. The CMOS latch circuit 10 is composed of higher threshold voltage transistors, two transfer gates TM1 and TM2, three inverter circuits INV1, INV2, and INV3, and two higher threshold voltage control transistors HP1 and HN1 for shutting off sub-threshold leakage currents.

The inverter circuit INV1 performs buffering of a data signal D supplied to the latch circuit 10 and is composed of a p-channel MOSFET of a lower threshold voltage and an n-channel MOSFET of a lower threshold voltage. The gate electrodes of the two transistors are connected to each other as a common input terminal for receiving the data signal D and the drain gates of the same connected to each other as a common output terminal.

The control transistor HP1 is composed of a p-channel MOSFET of a higher threshold voltage and is connected at its source electrode to the higher potential side actual power supply line VDD. In response to the sleep mode switching signal SL received at its gate electrode, the switching of the control transistor HP1 is controlled. The control transistor HN1 is composed of an n-channel MOSFET of a higher threshold voltage and is connected at its source electrode to the lower potential side actual power supply line GND. In response to the inverted sleep mode switching signal SLB received at its gate electrode, the switching of the control transistor HN1 is controlled. The source electrode of the lower threshold voltage p-channel MOSFET of the inverter circuit INV1 is connected to the drain electrode of the control transistor HP1. Similarly, the source electrode of the lower threshold voltage n-channel MOSFET of the inverter circuit INV1 is connected to the drain electrode of the control transistor HN1.

The transfer gate TM1 is composed of a p-channel MOSFET of a lower threshold voltage and an n-channel MOSFET of a lower threshold voltage. The source electrode of one transistor is joined to the drain electrode of the other, forming a parallel connection. One of the two joints is connected an output terminal of the inverter circuit INV1 and the other serves as an output of the latch circuit 10 for outputting a latch output signal QB to the succeeding stage.

A clock signal φ is applied to the gate electrode of the lower threshold voltage n-channel MOSFET of the transmission circuit TM1 while an inverted clock signal *φ which is an inverted form of the clock signal φ is applied to the gate electrode of lower threshold voltage p-channel MOSFET.

The transfer gate TM2 is substantially identical in the circuitry construction to the transfer gate TM1 and connected at one of its bi-directional electrodes to the input terminal of the inverter circuit INV3 and at the other to the output terminal of the inverter circuit INV2. The transfer gate TM2 may be composed of MOSFETs of either a low or a higher threshold voltage.

The inverter circuits INV2 and INV3 are substantially identical in the circuitry construction to the inverter circuit INV1. While the inverter circuit INV1 is composed of the lower threshold voltage MOSFETs, higher threshold voltage MOSFETs are used in the inverter circuits INV2 and INV3. The inverter circuit INV3 receives the latch output signal QB of the latch circuit 10 as an input signal, unlike the inverter circuit INV1. The inverter circuit INV3 is connected directly between the higher potential side actual power supply line VDD and the lower potential side actual power supply line GND, without passing through the control transistor HP1 as the higher threshold voltage p-channel MOSFET and the control transistor HN1 as the higher threshold voltage n-channel MOSFET. The output of the inverter circuit INV3 is connected to the input of the inverter circuit INV2. The inverter circuit INV2, like the inverter circuit INV3, is corrected directly between the higher potential side actual power supply line VDD and the lower potential side actual power supply line GND.

The operation of the latch circuit 10 shown in FIG. 1 will be described as a sequential circuit having a function of holding data in the sleep mode.

In particular, the inverted data signal D produced by the inverter circuit INV1 is taken at the timing of the clock signal $\phi$ and the inverted clock signal $*\phi$ supplied to the transfer gate TM1 and outputted as the output QB of the latch circuit 10 to the succeeding stage. The inverted data signal from the inverter circuit INV1 is received by the transfer gate TM1 only when the sleep mode switching signal SL and the inverted sleep mode switching signal SLB allow the inverter circuit INV1 to be connected to the power supply.

The output signal QB is also transmitted to the inverter circuit INV3 of which the output is connected to the inverter circuit INV2. The transfer gate TM2 transfers the output signal of the inverter circuit INV2 to the input terminal of the inverter circuit INV3 based on the clock signal $\phi$ and the inverted clock signal $*\phi$ such that the data signal is latched.

When the active mode is set while the sleep mode switching signal SL is in a low level (SL="0") and the inverted sleep mode switching signal SLB is in a high level (SLB="1"), the control transistors HP1 and HN1 are set to the conductive state. As a result, the semiconductor integrated logic device functions as a high speed latch circuit by the transistors of the inverter circuits INV1, INV2, and INV3 and of the transfer gates TM1 and TM2. In contrast, when the sleep mode switching signal SL is shifted to a high level (SL="1") and the inverted sleep mode switching signal SLB is shifted to a low level (SLB="0"), the control transistors HP1 and HN1 become non-conductive. Therefore, the power supply to the inverter circuit INV1 is stopped. The case is supposed that the sleep mode is initiated (SL="1", SLB="0") while the clock signal $\phi$ is maintained at the low level ($\phi$="0") and the inverted clock signal $*\phi$ is maintained at the high level ($*\phi$="1"). In this case, the bistable circuit constructed by the inverter circuits INV2 and INV3 and the transfer gate TM2 can hold the data and the latched data is not destroyed.

Also, in the sleep mode (SL="1", SLB="0"), the inverter circuit INV1 of the lower threshold voltage transistors is disconnected from the voltage supply lines VDD and GND by the higher threshold voltage control transistors HP1 and HN1. Therefore, an increase in the power consumption due to the sub-threshold voltage leakage can be avoided. Also, although the inverter circuits INV2 and INV3 connected directly to the power supply, there is no increase of the power consumption resulting from the sub-threshold voltage leakage in the sleep mode, because the inverter circuits INV2 and INV3 include the higher threshold voltage transistors.

The inverter circuit INV1 is a primary component of the sequential circuit, shown in FIG. 1, and has a function of holding data in the sleep mode and serves as a buffer for the data signal D. For this inverter circuit INV1, two higher threshold voltage switching elements may be used. That is, the control transistor HP1 of the higher threshold voltage p-channel MOSFET and the control transistor HN1 of the higher threshold voltage n-channel MSOFET need to be provided at both sides of the inverter circuit INV1 for connection to the higher potential side actual power supply line VDD and the lower potential side actual power supply line GND, respectively. Thus, excess higher threshold voltage transistors need to be provided.

Referring back to FIG. 1, it is supposed that the sleep mode (SL="1", SLB="0") is set when the output of the inverter circuit INV2 is "1", the output of the inverter circuit INV3 is "0", the clock signal $\phi$ is set to the low level ($\phi$="0") and the inverted clock signal $*\phi$ is set to the high level ($*\phi$="1"). In this case, the inverter circuit INV2 having the input of "0" and the output of "1" functions a leakage current source. The leakage current passes through the transfer gate TM2 in the conductive state, the transfer gate TM1 composed of the lower threshold voltage transistors in the non-conductive state, and the n-channel MOSFET in the inverter circuit INV1 composed of the lower threshold voltage transistors. Thus, the inverter circuit INV2 functions a sub-threshold leakage current source to the lower potential side actual power supply line GND. However, the control transistor HN1 of the higher threshold voltage n-channel MOSFET is set to the non-conductive state in response to the inverted sleep mode switching signal SLB. Therefore, the sub-threshold voltage leakage current is shut off by the transistor HN1.

Also, it is supposed that the sleep mode (SL="1", SLB="0") is set when the output of the inverter circuit INV2 is "0", the output of the inverter circuit INV3 is "1", the clock signal $\phi$ is maintained at its low level ($\phi$="0") and the inverted clock signal $*\phi$ is maintained at its high level ($*\phi$="1"). In this case, the inverter circuit INV2 having the input of "1" and the output of "0" functions as a leakage current source. The leakage current passes through the transfer gate TM2 in the conductive state, the transfer gate TM1 composed of the lower threshold voltage transistors in the non-conductive state, and the p-channel MOSFET composed of the lower threshold voltage transistor. Thus, the inverter circuit INV2 functions a sub-threshold leakage current source to the higher potential side actual power supply line VDD. However, the control transistor HP1 of the higher threshold voltage p-channel MOSFET is set in the non-conductive state in response to the sleep mode switching signal SL. Therefore, the sub-threshold voltage leakage current is shut off by the higher threshold voltage p-channel MOSFET HP1.

Moreover, the higher potential side actual power supply line VDD functions as a leakage current source. In this case, it could be considered that a leakage current path composed of the p-channel MOSFET in the inverter circuit INV1 composed of the lower threshold voltage transistor in the conductive or non-conductive state and the n-channel MOSFET in the inverter circuit INV1 composed of the lower threshold voltage transistor in the conductive or non-conductive state. Thus, the lower potential side actual power supply line GND functions as the leakage current demanding source. However, the control transistor HP1 of the higher threshold voltage p-channel MOSFET is provided between the p-channel MOSEFT in the inverter circuit INV1 and the higher potential side actual power supply line VDD to be set in the non-conduction state in response to the sleep mode switching signal SL. Therefore, the sub-threshold voltage leakage current can be shut off. In addition, the control transistor HN1 of the higher threshold voltage n-channel MOSFET is provided between the n-channel MOSEFT in the inverter circuit INV1 and the lower potential side actual power supply line GND to be set in the non-conduction state in response to the inverted sleep mode switching signal SLB. Therefore, the sub-threshold voltage leakage current can be shut off.

As described above, the latch circuit 10 in the conventional sequential circuit which has a function of holding data in the sleep mode needs to have the higher threshold voltage switching devices disposed between the inverter circuit INV1 and the higher potential side power supply line VDD and between the inverter circuit INVL and the lower potential side actual power supply line GND. Thus, the shutting off of the sub-threshold voltage leakage current is realized. This will increase the number of components required for the sequential circuit.

In conjunction with the above description, a semiconductor memory device is disclosed in Japanese Laid Open Patent Application (JP-A-Heisei 5-54693). In this reference, when a power is turned on, a fault address determining circuit (30) generates a redundancy determination signal YR and a fault address (A30). A Y address decoder (24) decodes the fault address (A30) to supply the decoding result to a transfer gate (23) and a redundancy latch circuit (32) which is provided for fault bit line pair (BL1$a$, BL1$b$). Thus, the redundancy latch circuit (32) is selected to set switches (33$a$, 33$b$) to an off state while the power is turned on. Therefore, a leakage current can be prevented from flowing to a word line (WL1) through the fault bit line pair (BL1$a$, BL1$b$) and a memory cell (1—1). In this way, increase of power consumption due to a short-circuit between bit lines and between word lines can be prevented.

Also, a static type transfer gate sequential circuit is disclosed in Japanese Laid Open Patent Applications (JP-A-Heisei 5-122020 and JP-A-Heisei 5-122021). In these references, the static type transfer gate sequential circuit is connected between CMOS logic circuits and is composed of a transfer gate (TG), two inverters (V1, V2), an input terminal (D), an output terminal (QB), and a clock input terminal (CC). One of terminals of the transfer gate (TG) is connected to the input terminal (D), and the other terminal is connected to an input terminal of the inverter (V1). The output terminal of the inverter (V1) is connected to the output terminal (QB) and the input terminal of the inverter (V2) whose output terminal is connected to the input terminal of the inverter (V1). In this reference, a resistance value in the signal path is adjusted in the viewpoint of the operation speed. In this way, the static type transfer gate sequential circuit can operate at same high speed as that of a dynamic type, as well as can cope with a low speed operation.

Also, a logic circuit is disclosed in Japanese Laid Open Patent Application (JP-A-Heisei 6-29834). In this reference, a lower threshold voltage logic circuit is connected between a higher potential side quasi power supply line and a lower potential side quasi power supply line. A higher potential side actual power supply line and a lower potential side actual power supply line are connected to the higher potential side quasi power supply line and the lower potential side quasi power supply line through higher threshold voltage transistors (TS1 and TS2), respectively.

Also, a D-type flip-flop circuit is disclosed in Japanese Laid Open Patent Application (JP-A-Heisei 7-202647). In this reference, a CMOS transfer gate for feeding back in the flip-flop circuit is not used. The CMOS flip-flop circuit is connected to a higher potential side power supply line and a lower potential side power supply line via a p-channel MOS transistor and an n-channel MOS transistor.

SUMMARY OF THE INVENTION

An object of the present invention is to provide a semiconductor circuit which can shut off a sub-threshold voltage leakage current.

Another object of the present invention is to provide a sequential circuit which can shut off a sub-threshold voltage leakage current.

In order to achieve an aspect of the present invention, a semiconductor circuit includes a logic circuit section and a latch circuit section. The logic circuit section includes higher and lower potential side actual power supply lines, higher and lower potential side quasi power supply lines, a CMOS logic circuit and a power connection section. The CMOS logic circuit is connected between the higher and lower potential side quasi power supply lines and is composed of MOS transistors having a first threshold voltage. The power connection section connects at least one of the higher and lower potential side actual power supply lines to a corresponding one of the higher and lower potential side quasi power supply lines. At this time, a remaining one of the higher and lower potential side actual power supply lines being directly connected to a corresponding one of the higher and lower potential side quasi power supply lines. Also, the power connection section includes at least one control MOS transistor having a second threshold voltage higher than the first threshold voltage. The latch circuit section includes a first CMOS inverter, a latch circuit and a transfer gate. The first CMOS inverter is connected between the higher and lower potential side quasi power supply lines. The latch circuit is operatively and selectively connected to the first CMOS inverter in series and is composed of second and third CMOS inverters connected in series. The transfer gate has the second threshold voltage and is disposed between the first CMOS inverter and the latch circuit.

The power connection section includes a first control MOS transistor disposed between the higher potential side actual power supply line and the higher potential side quasi power supply line. The lower potential side actual power supply line is directly connected to the lower potential side quasi power supply line. The power connection section is controlled in response to a signal indicating a sleep mode.

The power connection section may include a second control MOS transistor disposed between the lower potential side actual power supply line and the lower potential side quasi power supply line. The higher potential side actual power supply line is directly connected to the higher potential side quasi power supply line. In this case, the power connection section is controlled in response to an inverted signal of a signal indicating a sleep mode.

Also, the power connection section includes a first control MOS transistor and a second control MOS transistor. The first control MOS transistor is disposed between the higher potential side actual power supply line and the higher potential side quasi power supply line. The second control MOS transistor is disposed between the lower potential side actual power supply line and the lower potential side quasi power supply line. In this case, the power connection section is controlled in response to a signal indicating a sleep mode and an inverted signal of the sleep mode indicating signal.

Also, the latch circuit section may further include a first transfer gate connected between an output terminal of the latch circuit section and the transfer gate, wherein the latch circuit connected to the output terminal.

The latch circuit section may further include a first transfer gate connected between the first CMOS inverter and the transfer gate. A node between the transfer gate and the latch circuit is connected to the output terminal of the latch circuit section.

The transfer gate may include a single unit device. In this case, the transfer gate is controlled in response to a signal indicating a sleep mode and an inverted signal of the sleep mode indicating signal.

Also, the transfer gate may include a high threshold voltage p-channel MOS transistor and a high threshold voltage n-channel MOS transistor which are connected in parallel. In this case, the transfer gate is controlled in response to a signal indicating a sleep mode and an inverted signal of the sleep mode indicating signal.

Also, the transfer gate includes a high threshold voltage n-channel MOS transistor. In this case, the transfer gate is controlled in response to an inverted signal of a signal indicating a sleep mode. Also, a level of the inverted signal is equal to a sum of a voltage on the higher potential side quasi power supply line and the second threshold voltage.

In order to achieve another aspect of the present invention, a sequential circuit includes higher and lower potential side actual power supply lines, higher and lower potential side quasi power supply lines, a power connection section, a first CMOS inverter, a latch circuit and a transfer gate. The power connection section connects at least one of the higher and lower potential side actual power supply lines to a corresponding one of the higher and lower potential side quasi power supply lines. A remaining one of the higher and lower potential side actual power supply lines is directly connected to a corresponding one of the higher and lower potential side quasi power supply lines. Also, the power connection section includes at least one control MOS transistor having a second threshold voltage higher than the first threshold voltage. The first CMOS inverter is connected between the higher and lower potential side quasi power supply lines. The latch circuit is operatively and selectively connected to the first CMOS inverter in series and is composed of second and third CMOS inverters connected in series. The transfer gate has the second threshold voltage and disposed between the first CMOS inverter and the latch circuit.

DESCRIPTION OF THE PREFERRED EMBODIMENTS

Next, a semiconductor integrated logic circuit with a sequential circuit of the present invention will be described below in detail with reference to the attached drawings.

Figure 2:
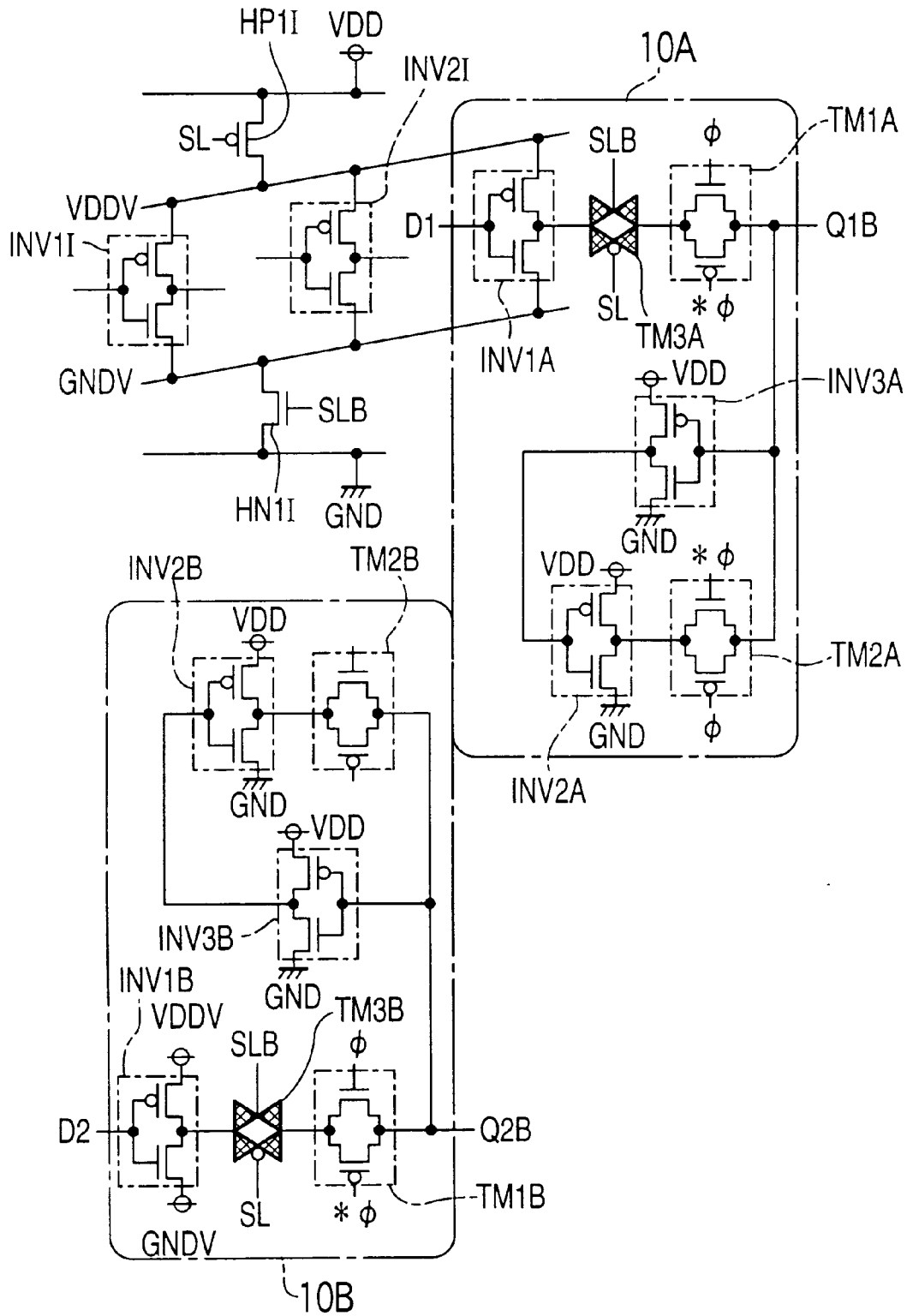
FIG. 2 is a circuit diagram of a semiconductor integrated logic circuit serving as a sequential circuit which has a function of holding data in the sleep mode, according to a first embodiment of the present invention.
Figure 3:
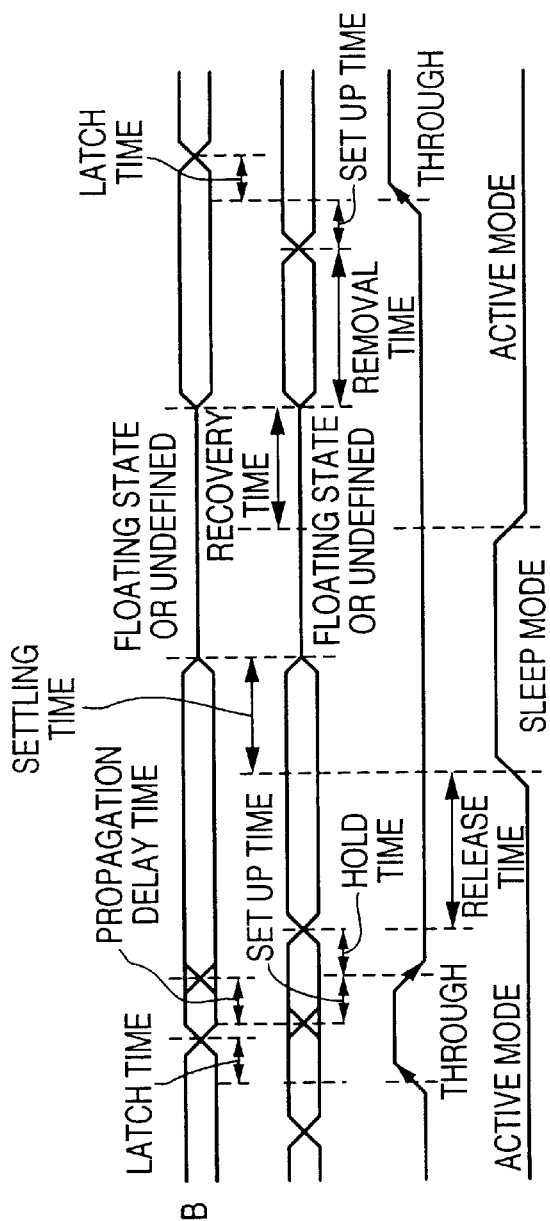
FIGS. 3A to 3D are timing charts showing the operation of the sequential circuit of the first embodiment of the present invention.

FIG. 2 is a circuit diagram of a semiconductor integrated logic circuit including a sequential circuit which has a function of holding data in a sleep mode, according to the first embodiment of the present invention. As shown in FIG. 2, a control transistor HP1I of a p-channel MOSFET of a higher threshold voltage is connected at its source electrode to a higher potential side actual power supply line VDD and at its drain electrode to a higher potential side quasi power supply line VDDV. In response to a sleep mode switching signal SL received at its gate electrode, the control transistor HP1I electrically connects or disconnects the higher potential side actual power supply line VDD to or from the higher potential side quasi power supply line VDDV. Similarly, a control transistor HN1I of an n-channel MOSFET of a higher threshold voltage is connected at its source electrode to a lower potential side actual power supply line GND and at its drain electrode to a lower potential side quasi power supply line GNDV. In response to an inverted sleep mode switching signal SLB received at its gate electrode, the control transistor HN1I electrically connects or disconnects the lower potential side actual power supply line GND to or from the lower potential side quasi power supply line GNDV. The inverted sleep mode switching signal SLB is a signal obtained by inverting the sleep mode switching signal SL and the signals SL and SLB are supplied from a sleep mode control circuit (not shown).

Figure 1:
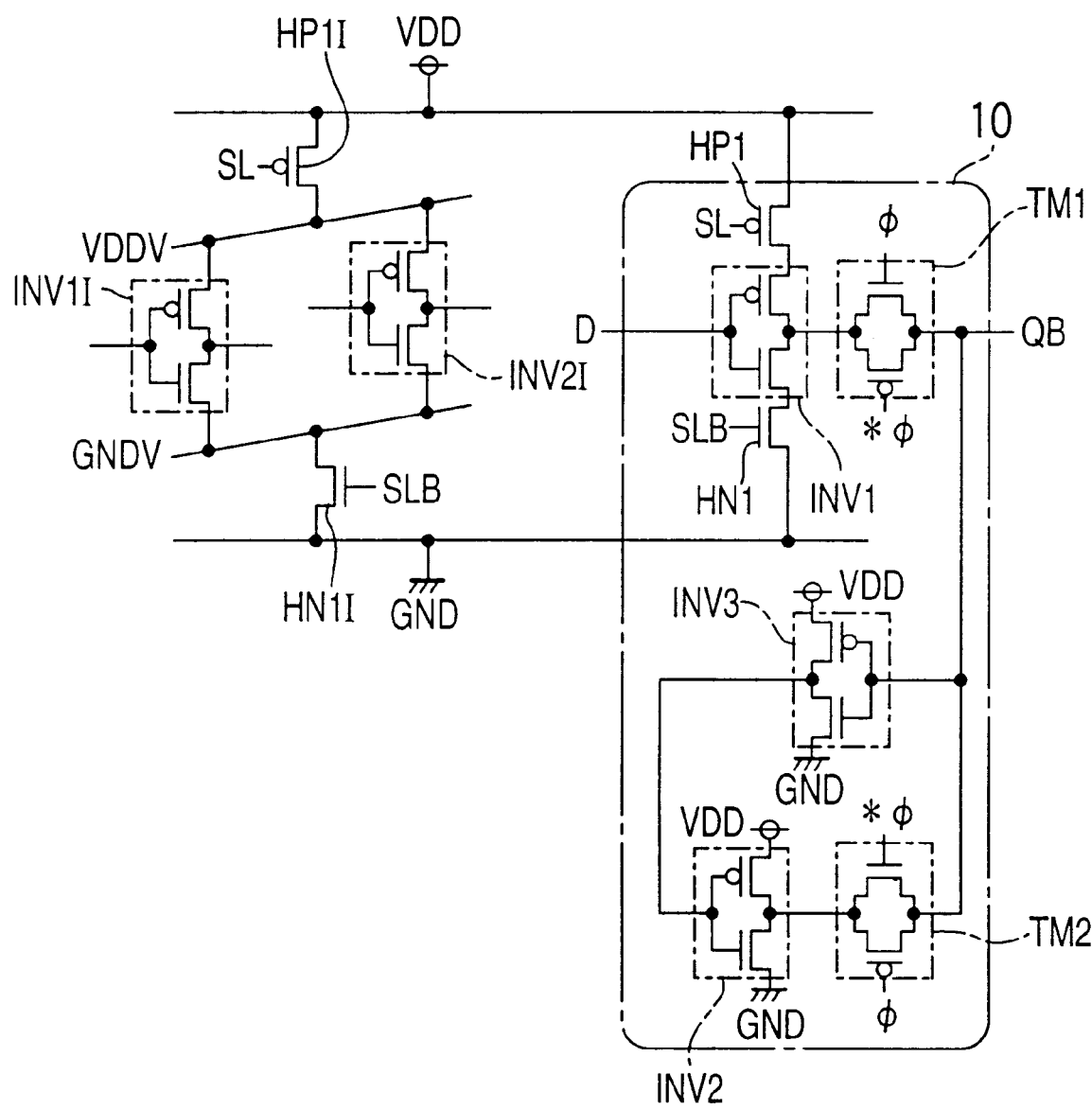
FIG. 1 is a circuit diagram of a conventional sequential circuit which has a function of holding data in a sleep mode.

The semiconductor circuit is designed in such a manner that the operation speed is primary. Therefore, a CMOS circuit section is connected between the higher potential side quasi power supply line VDDV and the lower potential side quasi power supply line GNDV and includes lower threshold voltage transistors. The CMOS circuit section has the same circuit structure as that shown in FIG. 1, and include an inverter circuit INV1I and an inverter circuit INV2I. Each of the inverter circuits INV1I and INV2I is composed of a p-channel MOSFET of a lower threshold voltage and an n-channel MOSFET of a lower threshold voltage. The gate electrodes of the two transistors are connected to each other as a common input terminal and the drain electrodes are connected to each other as a common output terminal. The lower threshold voltage p-channel MOSFET of the inverter circuits INV1I and INV2I is connected at its source electrode to the higher potential side quasi power supply VDDV. Also, the lower threshold voltage n-channel MOSFET of the inverter circuit INV1I is connected at its source electrode to the lower potential side quasi power supply line GNDV.

The sequential circuit having a function of holding data in the sleep mode includes latch circuits 10A and 10B, as shown in FIG. 2. In the first embodiment, the CMOS circuit section composed of the lower threshold voltage transistors is substantially the same as that of the conventional CMOS circuit section shown in FIG. 1. The CMOS latch circuit is composed of the latch circuits 10A and 10B including higher threshold voltage transistors. In the first embodiment, the two latch circuits is illustrated but the number of latch circuits is limited to this. The number of latch circuits may be at least one or more.

The latch circuit 10A is composed of two transfer gates TM1A and TM2A, three inverter circuits INV1A, INV2A, and INV3A, and a higher threshold voltage transfer gate TM3A for shutting off the sub-threshold voltage leakage current.

The inverter circuit INV1A carries out buffering of a data signal D1 supplied to the latch circuit 10 and is composed of a p-channel MOSFET of a lower threshold voltage and an n-channel MOSFET of a lower threshold voltage such that the sequential circuit has excellent operation speed. The gate electrodes of the two transistors are connected to each other forming a common input terminal for receiving the data signal D1 and the drain electrodes are connected to each other forming a common output terminal. The source electrode of the lower threshold voltage p-channel MOSFET in the inverter circuit INV1A is connected to the higher potential side quasi power supply line VDDV while the source electrode of the lower threshold voltage n-channel MOSFET in the inverter circuit INV1A is connected to the lower potential side quasi power supply line GNDV.

The transfer gate TM3A is a higher threshold voltage MOSFET in which one of the bi-directional electrodes is connected to the output terminal of the inverter circuit INV1A and the other is connected to one of the bi-directional electrodes of the transfer gate TM1A. The transfer gate TM3A is formed as a unit element. The transfer gate TM3A is controlled in the conductive state or non-conductive state in response to the control signals which are synchronized with the sleep mode switching signal SL and the inverted sleep mode switching signal SLB, respectively. More particularly, in the sleep mode, a high level of the sleep mode switching signal SL (SL="1") and a low level of the inverted sleep mode switching signal (SLB="0") are applied to the transfer gate TM3A such that the transfer gate TM3A is set to the non-conductive state. In an active mode other than the sleep mode, the transfer gate TM3A receives a low level of the sleep mode switching signal SL (SL="0") and a high level of the inverted sleep mode switching signal SLB (SLB="1"). Thus, the transfer gate TM3 is set to the conductive state.

The transfer gate TM1A is composed of a p-channel MOSFET of a lower threshold voltage and an n-channel MOSFET of a lower threshold voltage. The source electrode of one of the two transistors is connected to the drain electrode of the other hence forming a parallel connection. One electrode connection of the transfer gate TM1A is connected to the bi-directional electrode of the transfer gate TM3A and the other connection functions as an output terminal of the latch circuit 10 for outputting a latch output signal Q1B to the succeeding stage. The lower threshold voltage n-channel MOSFET of the transfer gate TM1A is supplied at its gate electrode with a clock signal $\phi$. Similarly, the lower threshold voltage p-channel MOSFET of the transfer gate TM1A is supplied at its gate electrode with an inverted clock signal $*\phi$ which is a signal obtained by inverting the clock signal $\phi$.

The transfer gate TM2A is identical in the circuitry construction to the transfer gate TM1A. One of the bi-directional electrodes is connected to the input terminal of the inverter circuit INV3A and the other is connected to the output terminal of the inverter circuit INV2A. The transfer gate TM2A may be composed of MOSFETs of either a lower threshold voltage or a higher threshold voltage.

The inverter circuits INV2A and INV3A are substantially identical in the circuitry construction to the inverter circuit INV1A. While the inverter circuit INV1A includes the lower threshold voltage MOSFETS, higher threshold voltage MOSFETs are used for the inverter circuits INV2A and INV3A. The inverter circuit INV3A receives the latch output signal Q1B of the latch circuit 10. Unlike the inverter circuit INV1A, the inverter circuit INV3A is connected directly between the higher potential side actual power supply line VDD and the lower potential side actual power supply line GND without passing through the control transistors HP1I of the higher threshold voltage p-channel MOSFET and the control transistor HN1 of the higher threshold voltage n-channel MOSFET. Also, the output of the inverter circuit INV3A is connected to the inverter circuit INV2A. The inverter circuit INV2A is like the inverter circuit INV3A, and is directly connected between the higher potential side actual power supply line VDD and the lower potential side actual power supply line GND. The output of the inverter circuit INV2 is connected to the input terminal of the inverter circuit INV3A through the transfer gate TM2A.

The latch circuit 10B is substantially identical in the circuitry construction to the latch circuit 10A, except that a data signal D2 is supplied via the inverter circuit INV1B to the latch circuit 10B and the output signal of the latch circuit 10B is specified as the signal Q2B which is an inverted signal of the signal D2.

The operation of the latch circuit 10A of the sequential circuit according to the first embodiment of the present invention will be described with reference to FIGS. 3A to 3D.

An inverted signal of the data signal D1 is supplied from the inverter circuit INV1A to the transfer gate TM1A via the transfer gate TM3A. The inverted data signal can be transferred from the inverter circuit INV1A to the transfer gate TM1A only when the power is supplied to the inverter circuit INV1A in response to the sleep mode switching signal SL and the inverted sleep mode switching signal SLB. At the same time, the transfer gate TM3A is set to the conductive state in response to the sleep mode switching signal SL and the inverted sleep mode switching signal SLB.

The data signal outputted from the transfer gate TM3A is taken in the transfer gate TM1A in response to the clock signal $\phi$ and the inverted clock signal $*\phi$ and is further outputted as the output signal Q1B of the latch circuit 10A to the succeeding stage. The latch output signal Q1B is also outputted to the inverter circuit INV3A of whose output is transferred to the inverter circuit INV2A. The transfer gate TM2A sends out the output signal of the inverter circuit INV2A to the input terminal of the inverter circuit INV3A at the timing of the clock signal $\phi$ and the inverted clock signal $*\phi$. Thus, the taken-in data signal is latched.

In the active mode where the sleep mode switching signal SL is in the low level (SL="0") and the inverted sleep mode switching signal SLB is in the high level (SLB="1"), the control transistors HP1I and HN1I and the transfer gate TM3A are set to the conductive state. Thus, the high speed latch circuit is operable by the transistors of the inverter circuits INV1A, INV2A, and INV3A and the transfer gates TM1A and TM2A. On the other hand, in the sleep mode where the sleep mode switching signal SL is in the high level (SL="1") and the inverted sleep mode switching signal SLB is in the low level (SLB="0"), the control transistors HP1I and HN1I are set to the non-conductive state. As a result, the power supply to the inverter circuit INV1A is stopped. Also, the transfer gate TM3A is set to the non-conductive state. Thus, the sending out of the data signal from the inverter circuit INV1A to the transfer gate TM1A is stopped.

When the sleep mode (SL="1", SLB="0") is set while the clock signal $\phi$ is maintained at the low level ($\phi$="0") and the inverted clock signal *ϕ is maintained at the high level (*ϕ="1"), a bistable circuit composed of the inverter circuits INV2A and INV3A and the transfer gate TM2A in the conductive state holds the data signal. Thus, the internal state of the latch circuit is not destroyed.

The reason why there is no increase of the power consumption resulting from the sub-threshold voltage leakage in the sequential circuit according to the first embodiment of the present invention, will be now described in more detail.

In the sleep mode where the sleep mode switching signal SL of the high level (SL="1") and the inverted sleep mode switching signal SLB of the low level (SLB="0") are applied, the control transistors HP1I and HN1I are set to the non-conductive state.

In this state, it is now assumed that the sleep mode (SL="1", SLB="0") is set while the clock signal ϕ and the inverted clock signal *ϕ are fixed to the low level and the high level(ϕ=="0", *ϕ="1"), respectively, when the output of the inverter circuit INV2A is "1" (with the output of the inverter circuit INV3A being "0") in the latch circuit 10A, and the output of the inverter circuit INV2B is "0" (with the output of the inverter circuit INV3B being "1") in the latch circuit 10B.

In the semiconductor integrated logic circuit of FIG. 2, no direct current due to the sub-threshold voltage leakage flows from the higher potential side actual power supply line VDD to the lower potential side actual power supply line GND. More particularly, the inverter circuit INV2A having the input of "0" and the output of "1" may function as a leakage current source. The leakage current may flow through the following path. That is, it could be considered that the following path is composed of the transfer gate TM2A in the conductive state, the transfer gate TM1A composed of the lower threshold voltage transistors in the non-conductive state to have a high level of sub-threshold voltage leakage, the transfer gate TM3A, and the n-channel MOSFET of the inverter circuit INV1A which in the conductive state or the non-conductive state and is composed of the lower threshold voltage transistor to have a high level of sub-threshold voltage leakage, and the lower potential side quasi power supply line in a floating state.

In contrast, a direct current which is generated based on the sub-threshold voltage leakage, may flow from the lower potential side quasi power supply line in the floating state. In this case, it could be considered that the path is composed of the n-channel MOSFET of the inverter circuit INV1B which in the conductive or non-conductive state and is composed of the lower threshold voltage transistors to have a high level of sub-threshold voltage leakage, the transfer gate TM3B, the transfer gate TM1B which includes the lower threshold voltage transistors in the non-conductive state to have a high level of sub-threshold voltage leakage, the transfer gate TM2B in the conductive state, and the inverter circuit INV2B having the input of "1" and the output of "0".

However, in the first embodiment of the present invention, the transfer gates TM3A and TM3B have higher threshold voltages to shut off the sub-threshold voltage leakage current, and are provided on the main leakage current paths in the latch circuits 10A and 10B, respectively. Therefore, this prevents the sub-threshold voltage leakage from increasing the power consumption.

Also, in the semiconductor circuit of the first embodiment of the present invention, even if the two latch circuits 10A and 10B exist in the sequential circuit, there is no increase of the power consumption resulting from the sub-threshold voltage leakage so long as the two latch circuits 10A and 10B are provided independently from each other.

In the two or more latch circuits, the sub-threshold voltage leakage may flow between the higher potential side actual power supply line VDD and the lower potential side power supply line GND through the two inverter circuits INV1A and INV1B and the control transistors HP1I and HN1I of the higher threshold voltages, respectively.

However, in the sleep mode (SL="1", SLB="0"), the inverter circuits INV1A and INV1B composed of the lower threshold voltage transistors are supplied with power applied via the higher threshold voltage control transistors HP1I and HN1I. The control transistors HP1I and HN1I are set to the non-conductive state. Therefore, there is no increase of the power consumption resulting from the sub-threshold voltage leakage.

Although the inverter circuits INV2A and INV2B are supplied directly with the power, there is no increase of the power consumption in the sleep mode, because the inverter circuits INV2A and INV2B are composed of higher threshold voltage transistors.

As described above, in the latch circuits 10A and 10B of the sequential circuit according to the first embodiment of the present invention, the higher potential side quasi power supply line VDDV and the lower potential side quasi power supply line GNDV are connected to the inverter circuits INV1A and INV1B which are essential components of the latch circuits 10A and 10B, respectively.

Secondly, the transfer gates TM3A and TM3B having higher threshold voltages are provided in the latch circuits 10A and 10B to shut off the sub-threshold voltage leakage currents, respectively.

Figure 4:
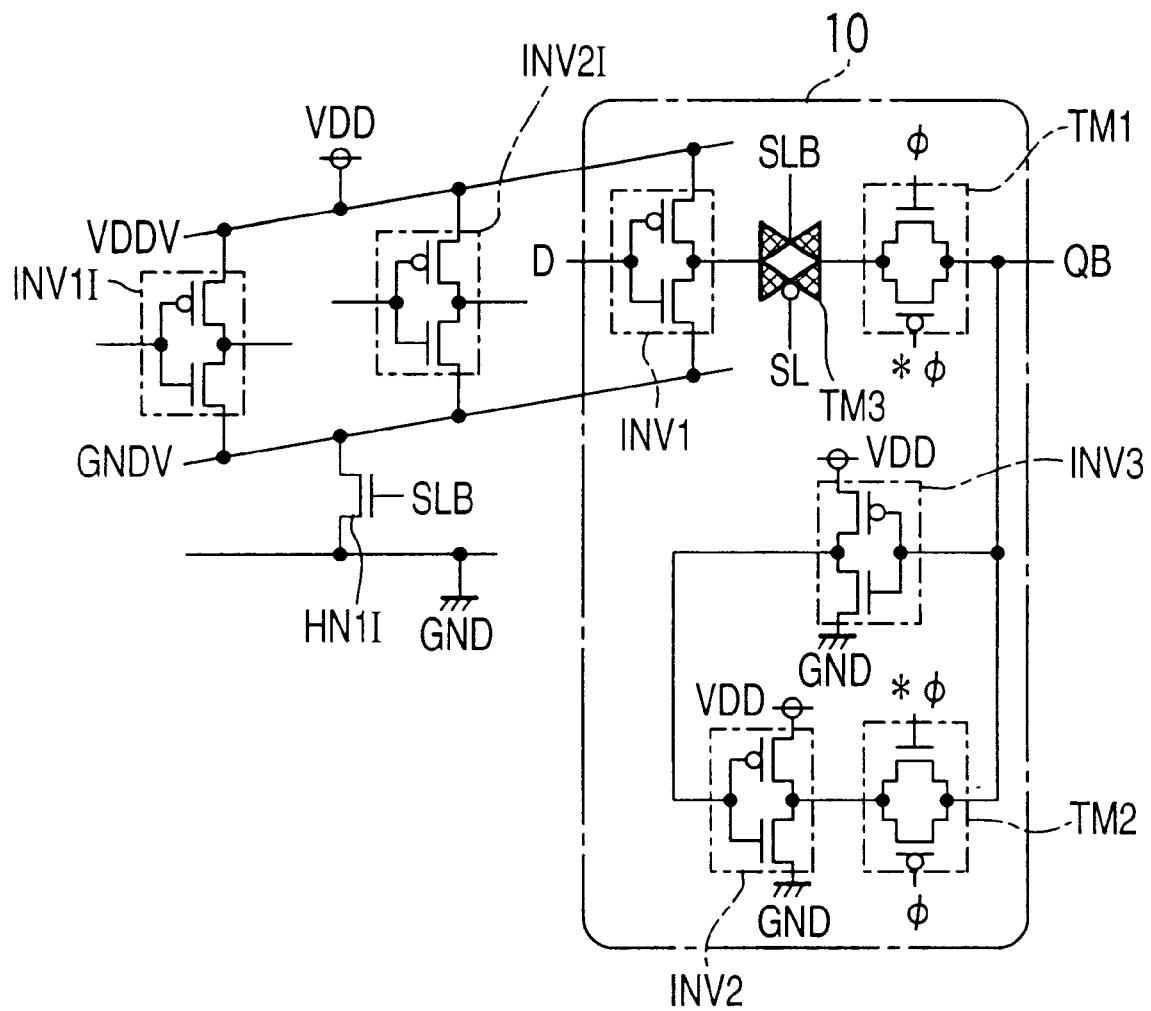
FIG. 4 is a circuit diagram of the sequential circuit according to a second embodiment of the present invention.

FIG. 4 is a circuit diagram of the semiconductor circuit with the sequential circuit according to the second embodiment of the present invention. Referring to FIG. 4, the semiconductor circuit in the second embodiment is substantially identical in the circuitry construction to the sequential circuit shown in FIG. 2. The second embodiment is different from the first embodiment in that the data signal and the output signal of the latch circuit 10 are specified by D and QB, respectively and the higher potential side quasi power supply line VDDV is not used and the higher potential side actual power supply line VDD is used for the CMOS circuit section and an inverter circuit INV1 of the latch circuit 10.

A control transistor HN1I composed of an n-channel MOSFET of a higher threshold voltage is connected at its source electrode to the lower potential side actual power supply line GND and at the drain electrode to the lower potential side quasi power supply line GNDV. In response to the inverted sleep mode switching signal SLB received at its gate electrode, the control transistor HN1I electrically connects or disconnects the lower potential side actual power supply line to or from the lower potential side quasi power supply line. The inverted sleep mode switching signal SLB is a signal obtained by inverting the sleep mode switching signal SL, and the sleep mode switching signal SL and the inverted sleep mode switching signal SLB are supplied from a sleep mode control circuit (not shown).

As shown in FIG. 4, a CMOS circuit section composed of lower threshold voltage transistors has the same circuitry arrangement to that of the CMOS circuit section of the first embodiment shown in FIG. 2 and includes inverter circuits INV1I and INV2I. Each of the inverter circuits INV1I and INV2I is composed of a p-channel MOSFET of a lower threshold voltage and an n-channel MOSFET of a lower threshold voltage. The gate electrodes of the two transistors are connected to each other as a common input terminal and the drain electrodes are connected to each other as a common output terminal. The source electrodes of the lower threshold voltage p-channel MOSFETs in the inverter circuits INV1I and INV2I are connected directly to the higher potential side actual power supply line, unlike the inverter circuits INV1I and INV2I shown in FIG. 2. In contract, the source electrodes of the lower threshold voltage n-channel MOSFETs of the inverter circuits INV1I and INV2I are connected to the lower potential side quasi power supply line, like the inverter circuits INV1I and INV2I shown in FIG. 2.

In the latch circuit 10 of the sequential circuit in the second embodiment has a function of holding data in the sleep mode, the higher potential side actual power supply line VDD is directly connected to the source electrode of a p-channel transistor of a lower threshold voltage in the inverter circuit INV1 and the lower potential side actual power supply line GNDV is connected to a drain electrode of an n-channel transistor of a lower threshold voltage in the inverter circuit INV1. Thus, because the higher potential side quasi power supply line VDDV may be eliminated, a chip area efficiency can be increased.

There is no increase of the power consumption resulting from the sub-threshold voltage leakage even if the circuitry arrangement of the second embodiment is adopted where the control transistor HP1I is eliminated and the higher potential side actual power supply line VDD is directly used.

It is assumed that the sleep mode (SL="1", SLB="0") is set while the clock signal $\phi$ is fixed to the low level ($\phi$="0") and the inverted clock signal *$\phi$ is fixed to the high level (*$\phi$="1") when the inverter circuit INV2 outputs "0" and the inverter circuit INV3 outputs "1". In this case, there may be the following leakage current path. That is, the leakage current path is composed of the inverter circuit INV2 having the input of "1" and the output of "0", a transfer gate TM2 in the conductive state, a transfer gate TM1 of a lower threshold voltage transistor closed to have a high level of sub-threshold voltage leakage, a transfer gate TM3, the lower threshold voltage p-channel MOSFET of an inverter circuit INV1 in the conductive or non-conductive state to have a high level of sub-threshold voltage leakage, and the higher potential side actual power supply line VDD. However, the transfer gate TM3 of the higher threshold voltage in the non-conductive state is disposed between the inverter circuit INV1 and the transfer gate TM1 to shut off the leakage currents due to the sub-threshold voltage leakage. As a result, there is no increase of the power consumption.

Figure 5:
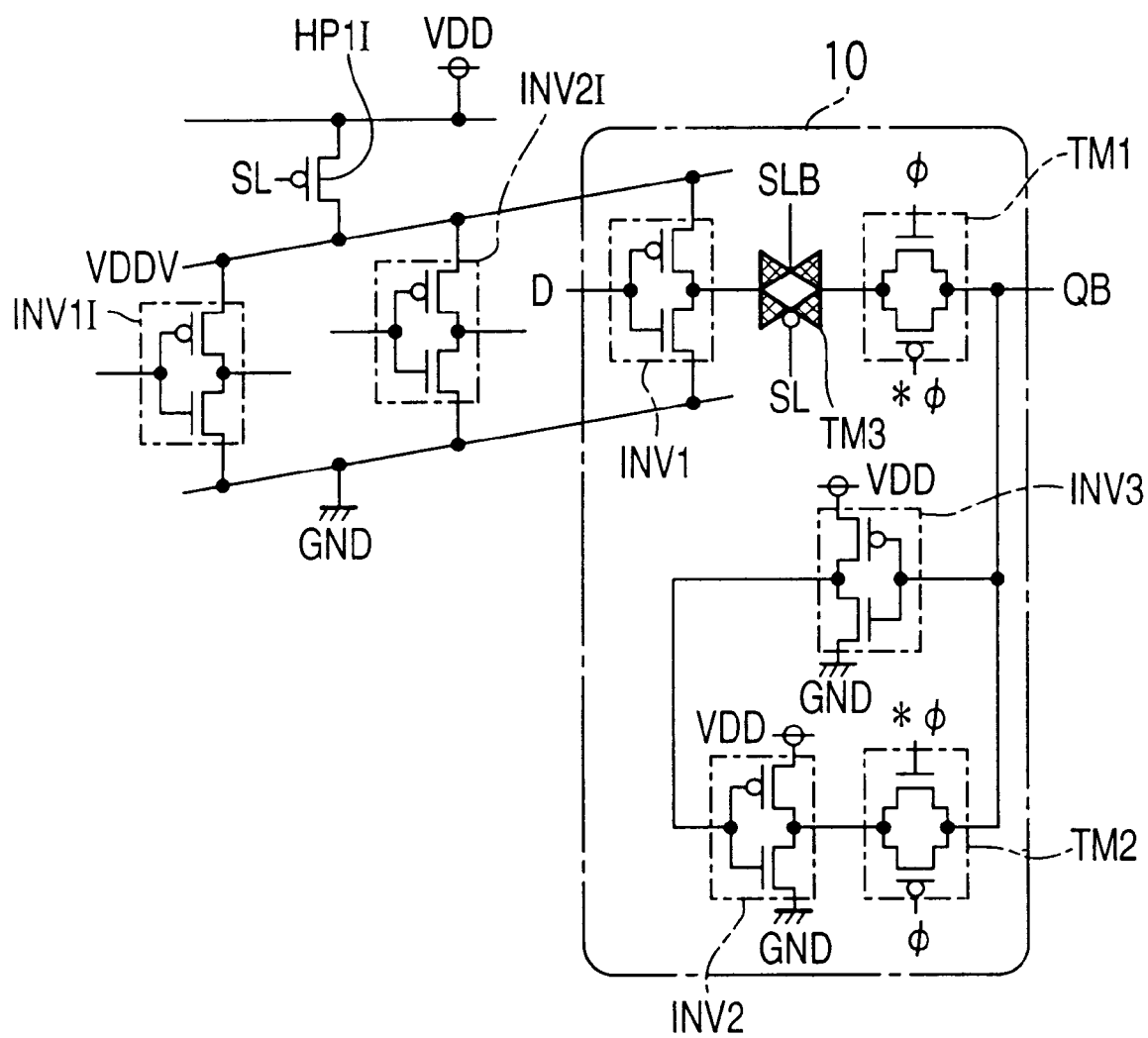
FIG. 5 is a circuit diagram of the sequential circuit which has a function of holding data in a sleep mode, according to a third embodiment of the present invention.

FIG. 5 is a circuit diagram of the semiconductor circuit with the sequential circuit which has a function of holding data in the sleep mode, according to the third embodiment of the present invention. Referring to FIG. 5, the semiconductor circuit according to the third embodiment of the present invention has substantially the same circuitry construction as that of the sequential circuit in the first embodiment. The third embodiment is different from the first embodiment in that the input signal and the output signal are specified by D and QB, respectively, and that the lower potential side quasi power supply line GNDV connected to the inverter circuit INV1 of the latch circuit 10A shown in FIG. 2 is replaced by the lower potential side actual power supply line GND.

A control transistor HP1I of a higher threshold voltage p-channel MOSFET is connected at its source electrode to the higher potential side actual power supply line VDD and at its drain electrode to the higher potential side quasi power supply line VDDV. In response to the sleep mode switching signal SL received at its gate electrode, the control transistor HP1I electrically connects or disconnects the higher potential side actual power supply line to or from the higher potential side quasi power supply line. The sleep mode switching signal SL and the inverted sleep mode switching signal SLB are supplied from a sleep mode control circuit (not shown).

The CMOS circuit section composed of lower threshold voltage transistors in the third embodiment shown in FIG. 5 is designed for the operation speed to be primary and substantially the same as that of the first embodiment shown in FIG. 2, including the inverter circuits INV1I and INV2I.

Each of the inverter circuits INV1I and INV2I is composed of a p-channel MOSFET of a lower threshold voltage and an n-channel MOSFET of a lower threshold voltage. The gate electrodes of the two transistors are connected to each other as a common input terminal and the drain electrodes are also connected to each other as a common output terminal. The source electrodes of the lower threshold voltage n-channel MOSFETs of the inverter circuits INV1I and INV2I are connected directly to the lower potential side actual power supply line, unlike the inverter circuits INV1I and INV2I shown in FIG. 2. The source electrodes of the lower threshold voltage p-channel MOSFETs of the inverter circuits INV1I and INV2I are connected to the higher potential side quasi power supply line VDDV which is connected to the higher potential side power supply line VDD through the control transistor HP1I, like the inverter circuits INV1I and INV2I of FIG. 2.

The latch circuit 10 in the sequential circuit in the third embodiment has a function of holding data in the sleep mode. The latch circuit 10 is different from that of the first embodiment shown in FIG. 2 in that the source electrode of the n-channel transistor in the inverter circuit INV1 is directly connected to not the lower potential side quasi power supply line GNDV but the lower potential side actual power supply line GND. Because the lower potential quasi power supply line GNDV may be eliminated, the chip area use efficiency is increased.

In the third embodiment, there is no increase of the power consumption resulting from the sub-threshold voltage leakage even if the control transistor HN1I is eliminated so that the lower potential actual power supply line GND is connected directly.

It is assumed that the sloop mode (SL="1", SLB="0") is set while the clock signal $\phi$ is fixed to the low level ($\phi$="0") and the inverted clock signal *$\phi$ is fixed to the high level (*$\phi$="1") when the inverter circuit INV2 outputs "1" and the inverter circuit INV3 outputs "0". In this case, it could be considered that the inverter circuit INV2 having the input of "0" and the output of "1" functions as a leakage current source and there is the following leakage current path. It could be considered that the leakage current path is composed of a transfer gate TM2 in the conductive state, a transfer gate TM1 of a lower threshold voltage transistor in the non-conductive state to have a high level of sub-threshold voltage leakage, a transfer gate TM3, and the lower threshold voltage p-channel MOSFET of the inverter circuit INV1 to have a high level of sub-threshold voltage leakage regardless of its state, and the lower potential side actual power supply line GND. However, because the higher threshold voltage transfer gate TM3 in the non-conductive state is disposed between the inverter INV1 and the transfer gate TM1, the sub-threshold voltage leakage current is shut off. As a result, there is no increase of the power consumption.

Figure 6:
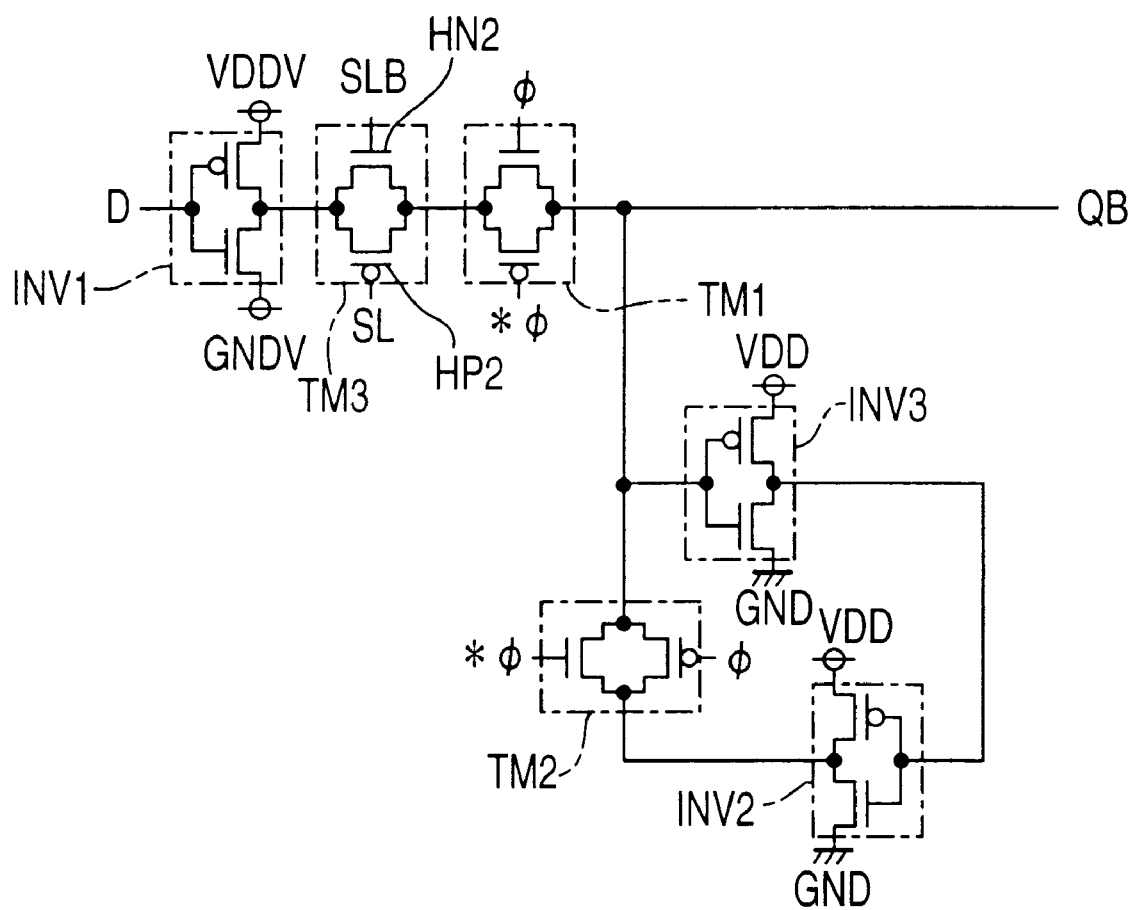
FIG. 6 is a circuit diagram of the sequential circuit which has a function of holding data in the sleep mode, according to a fourth embodiment of the present invention.

FIG. 6 is a circuit diagram of the semiconductor circuit of the sequential circuit which has a function of holding data in the sleep mode, according to the fourth embodiment of the present invention. Referring to FIG. 6, the semiconductor circuit according to the fourth embodiment of the present invention has substantially the same circuit structure as that of the latch circuit 10A shown in FIG. 2. The fourth embodiment is different from the first embodiment in that its output signal is specified by QB and a combination of transistors is used for realizing the transfer gate TM3A of the latch circuit 10A shown in FIG. 2.

As shown in FIG. 6, the transfer gate TM3 is composed of a higher threshold voltage p-channel MOSFET HP2 and a higher threshold voltage n-channel MOSFET HN2. The source electrode of one transistor is connected to the drain electrode of the other, so as to form a parallel connection. The inverted sleep mode switching signal SLB which is a signal obtained by inverting the sleep mode switching signal SL is applied to the gate electrode of the higher threshold voltage n-channel MOSFET of the transistor HN2, and the sleep mode switching signal SL is applied to the gate electrode of the higher threshold voltage p-channel MOSFET of the transistor HP2 in the transfer gate TM3. In the sleep mode, the application of the sleep mode switching signal SL of the higher potential voltage VDD (SL="1") and the inverted sleep mode switching signal SLB of the lower potential voltage GND (SLB="0") are applied to the gates of the transistors HN2 and HP2, respectively. As a result, the transfer gate TM3 is set to the non-conductive state. In the active mode, the application of the sleep mode switching signal SL of the lower potential voltage GND (SL="0") and the inverted sleep mode switching signal SLB of the higher potential voltage VDD (SLB="1") allows the transfer gate TM3 to be set to the conductive state. Thus, this controls the opening and closing operation of the transfer gate TM3.

Figure 7:
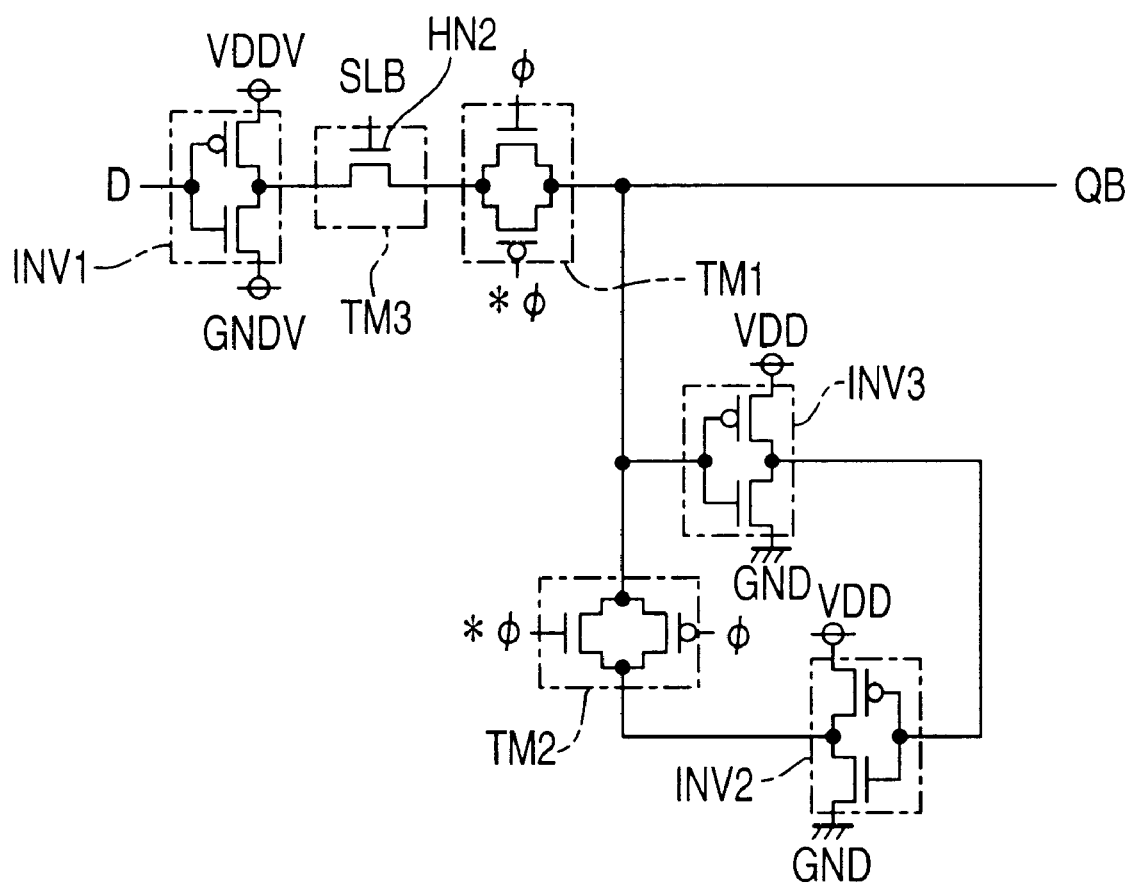
FIG. 7 is a circuit diagram of the sequential circuit which has a function of holding data in the sleep mode, according to a fifth embodiment of the present invention.

FIG. 7 is a circuit diagram of the latch circuit of the sequential circuit which has a function of holding data in the sleep mode, according to the fifth embodiment of the present invention. Referring to FIG. 7, the latch circuit according to the fifth embodiment of the present invention is substantially the same as the circuitry construction of the latch circuit 10A shown in FIG. 1. The fifth embodiment is different from the first embodiment in that the input signal and the output signal are specified by D and QB, respectively and a single transistor is used for the transfer gate TM3 in the latch circuit 10A shown in FIG. 1.

The transfer gate TM3 shown in FIG. 7 is composed of a higher threshold voltage transistor HN2 of an n-channel MOSFET. The higher threshold voltage transistor HN2 of the n-channel MOSFET is supplied at the gate electrode with the inverted sleep mode switching signal SLB which is a signal obtained by inverting the sleep mode switching signal SL. In the sleep mode, the inverted sleep mode switching signal SLB at the lower potential voltage GND (SLB="0") is applied to the transfer gate TM3 such that the transfer gate TM3 is set to the non-conductive state. In the active mode, the sleep mode switching signal SL at the higher potential voltage VDD (SL="1") is applied to the transfer gate TM3 such that the transfer gate TM3 is set to the conductive state. This controls the opening and closing operations of the transfer gate TM3.

Also, in the active mode, the voltage level of the inverted sleep mode switching signal SLB (SLB="1") is adjusted to a level equal to a sum of the higher potential voltage VDD and the threshold voltage of the n-channel MOSFET of the higher threshold voltage transistor HN2. This allows the level of the higher potential side voltage VDD to be maintained when the data signal D at the higher potential side voltage VDD (D="1") is transmitted via the transfer gate TM3 to the transfer gate TM1 at the following stage.

The transfer gate TM3 in the fifth embodiment shown in FIG. 7 is not limited to the higher threshold voltage transistor HN2 of the n-channel MOSFET controlled by the inverted sleep mode switching signal SLB whose voltage level is adjusted to a level equal to a sum of the higher potential side voltage and the threshold voltage of the n-channel MOSFET of the higher threshold voltage transistor HN2. More specifically, the transfer gate TM3 may be composed of a p-channel MOSFET of a higher threshold voltage controlled by the sleep mode switching signal SL whose voltage level is adjusted to a level equal to a sum of the lower potential side voltage and the threshold voltage of the higher threshold voltage p-channel MOSFET.

Figure 8:
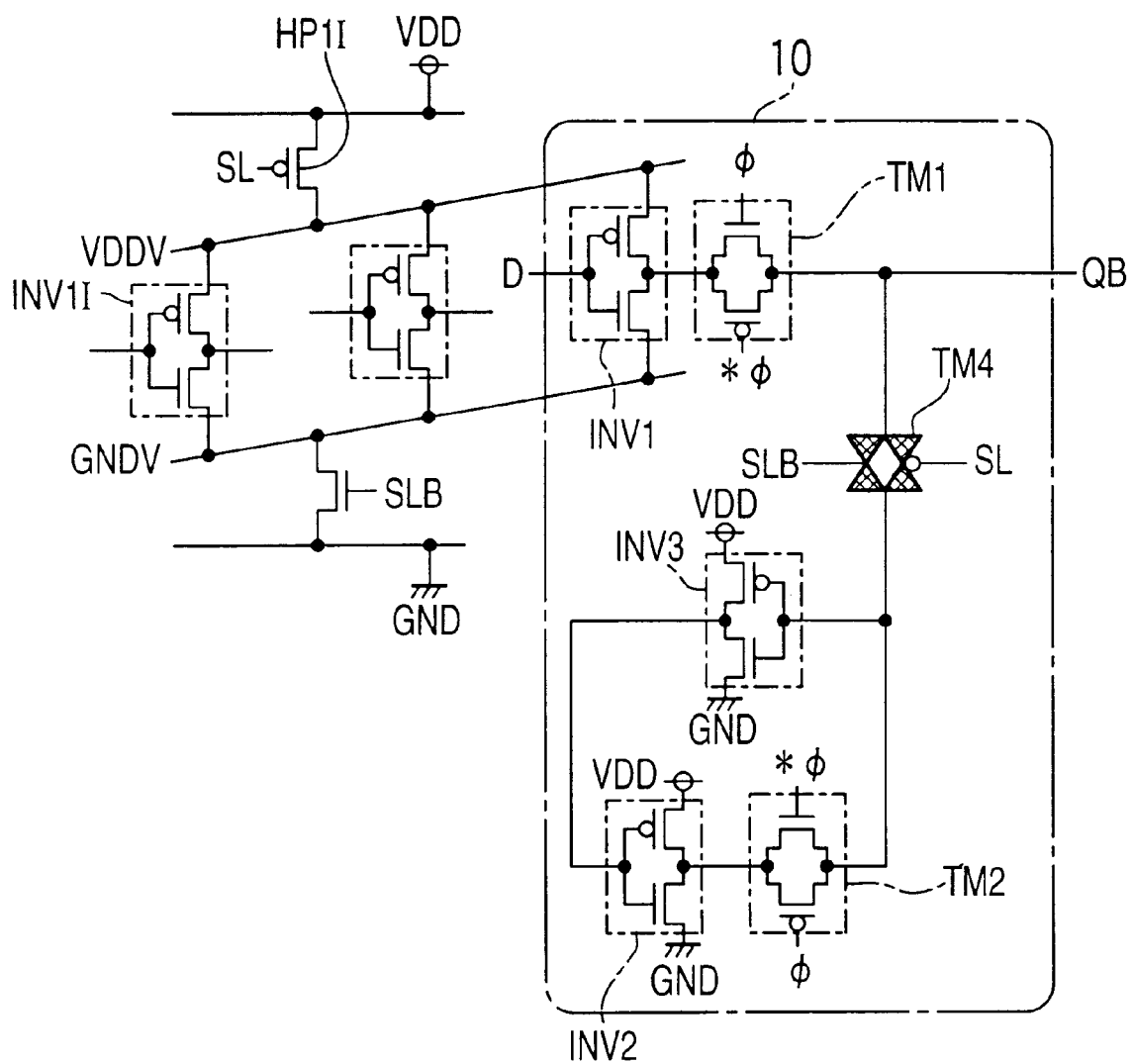
FIG. 8 is a schematic diagram of the sequential circuit which has a function of holding data in the sleep mode, according to a sixth embodiment of the present invention.

FIG. 8 is a circuit diagram of the semiconductor circuit with the sequential circuit which has a function of holding data in the sleep mode, according to the sixth embodiment of the present invention. Referring to FIG. 8, the semiconductor circuit according to the sixth embodiment of the present invention is substantially the same as the circuitry construction of the sequential circuit in the first embodiment shown in FIG. 2. However, the sixth embodiment is different from the first embodiment in that the output signal is specified by QB when the data signal D has been supplied and the transfer gate TM3 in the latch circuit 10A shown in FIG. 2 is replaced by a transfer gate TM4 which provides the same function. The latch circuit 10 shown in FIG. 8 is composed of two transfer gates TM1 and TM2, three inverter circuits INV1, INV2, and INV3, and a higher threshold voltage transfer gate TM4 for shutting off the sub-threshold voltage leakage current.

The inverter INV1 is composed of a p-channel MOSFET of a lower threshold voltage and an n-channel MOSFET of a lower threshold voltage such that the operation speed is primary. The inverter INV1 buffers the data signal D supplied to the latch circuit 10. The gate electrodes of the two transistors are connected to each other as a common input terminal for receiving the data signal D and the drain electrodes of the same are connected to each other as a common output terminal. The source electrode of the lower threshold voltage p-channel MOSFET in the inverter circuit INV1 is connected to the higher potential side quasi power supply line VDDV and the source electrode of the lower threshold voltage n-channel MOSFET is connected to the lower potential side quasi power supply line GNDV. In response to the sleep mode switching signal SL received at its gate electrode, the control transistor HP1I of a higher threshold voltage p-channel MOSFET electrically connects or disconnects the higher potential side actual power supply line VDD to or from the higher potential side quasi power supply line VDDV. In response to the inverted sleep mode switching signal SLB received at its gate electrode, the control transistor HN1I of a higher threshold voltage n-channel MOSFET electrically connects or disconnects the lower potential side actual power supply line GND to or from the lower potential side quasi power supply line GNDV.

The transfer gate TM1 is composed of a combination of a lower threshold voltage p-channel MOSFET and a lower threshold voltage n-channel MOSFET. The source electrode of one transistor is connected to the drain electrode of the other so as to form a parallel connection. One of the two electrode connections is connected to the output of the inverter circuit INV1 and the other serves as the output terminal of the latch circuit 10 for outputting the latch output signal QB to the succeeding stage. The clock signal φ is applied to the gate electrode of the lower threshold voltage n-channel MOSFET and the inverted clock signal *φ which is an inverted form of the clock signal φ is applied to the gate electrode of the lower threshold voltage p-channel MOSFET in the transfer gate TM1.

The transfer gate TM4 is composed of a higher threshold voltage MOSFET whose bi-directional electrodes are connected at one side to the bi-directional electrode at the output side of the transfer gate TM1 and at the other to the input terminal of the inverter circuit INV3. The conductive state and non-conductive state of the transfer gate TM4 is controlled in response to the sleep mode switching signal SL and the inverted sleep mode switching signal SLB which is an inverted form of the sleep mode switching signal SL. More specifically, when the high level of the sleep mode switching signal SL (SL="1") and the lower level of the inverted sleep mode switching signal (SLB="0") are applied, the transfer gate TM4 is set to the non-conductive state. In the active mode, the sleep mode switching signal SL at the low level (SL="0") and the inverted sleep mode switching signal SLB at the high level (SLB="1") are applied, so that the transfer gate TM4 is set to the conductive state.

The transfer gate TM2 is the same as circuitry construction of the transfer gate TM1, in which one of the bi-directional electrodes is connected to the input terminal of the inverter circuit INV3 and the other is connected to the output terminal of the inverter circuit INV2. The transfer gate TM2 may is composed of a lower threshold voltage or a higher threshold voltage MOSFET.

The inverter circuits INV2 and INV3 are substantially the same as the circuitry construction to the inverter circuit INV1. However, the higher threshold voltage MOSFETs are used in the inverter circuits INV2 and INV3 while the inverter circuit INV1 is composed of the lower threshold voltage MOSFETS. The inverter circuit INV3 in the latch circuit 10 is connected directly between the higher potential side actual power supply line VDD and the lower potential side actual power supply line GND, unlike the inverter circuit INV1. The output of the inverter circuit INV3 is connected to the input of the inverter circuit INV2. Like the inverter circuit INV3, the inverter circuit INV2 is connected directly between the higher potential side actual power supply line VDD and the lower potential side actual power supply line GND.

Accordingly, the transfer gate TM4 functions in the same manner as those of the transfer gates TM3A and TM3B in the latch circuit 10A shown in FIG. 2. In the latch circuit 10 shown in FIG. 8, the higher threshold voltage transfer gate TM4 is disposed between the transfer gate TM1 and the inverter circuit INV3.

Figure 9:
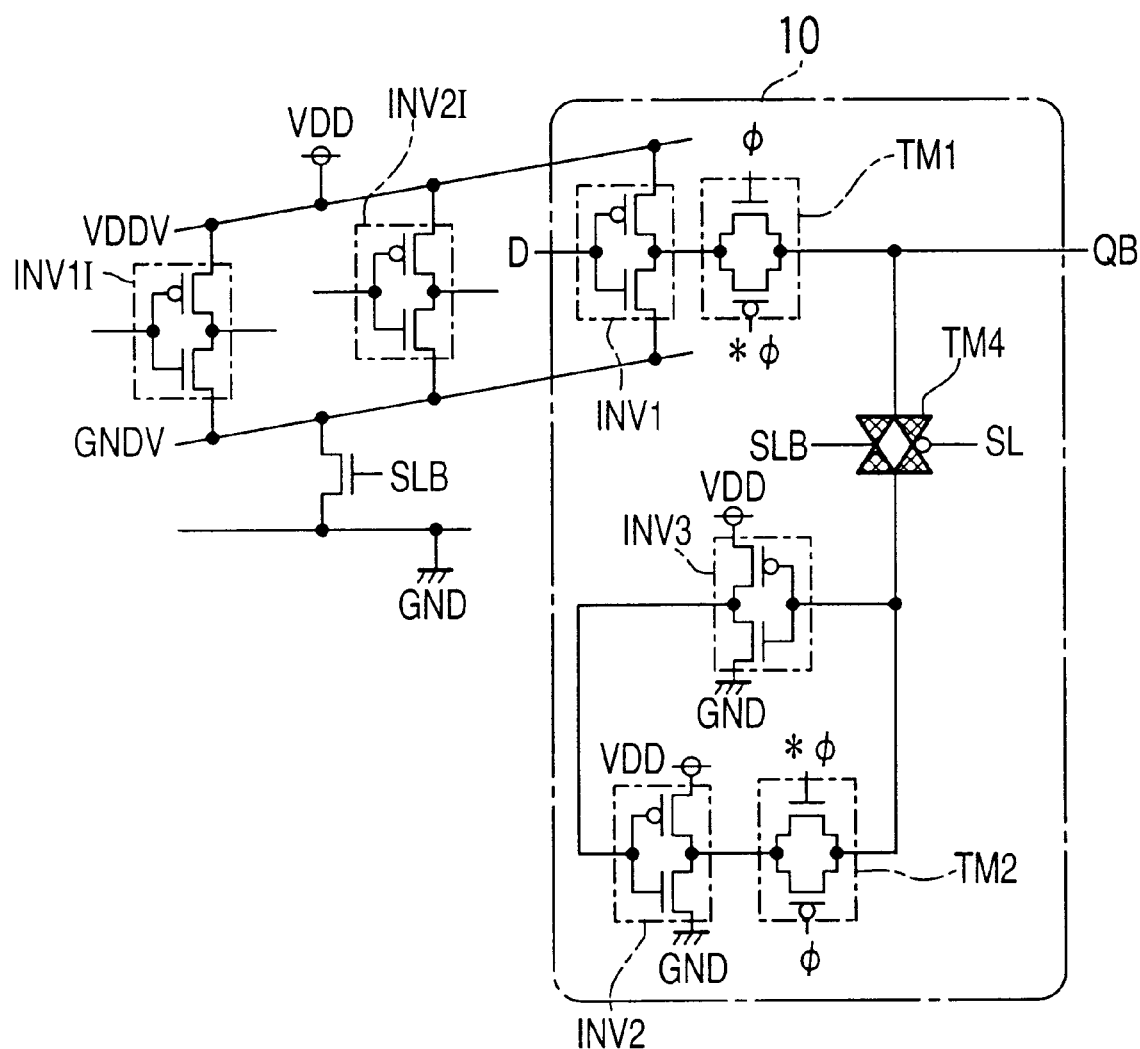
FIG. 9 is a circuit diagram of the sequential circuit which has a function of holding data in the sleep mode, according to a seventh embodiment of the present invention.

FIG. 9 is a schematic diagram of the semiconductor circuit with the sequential circuit which has a function of holding data in the sleep mode, according to the seventh embodiment of the present invention. Referring to FIG. 9, the semiconductor circuit in the seventh embodiment has substantially the same circuitry construction as that of the latch circuit 10 shown in FIG. 8. The seventh embodiment is different from the sixth embodiment in that the output signal is specified by QB as the data signal D has been supplied and the inverter circuit INV1 is connected directly to the higher potential side actual power supply line VDD.

Figure 10:
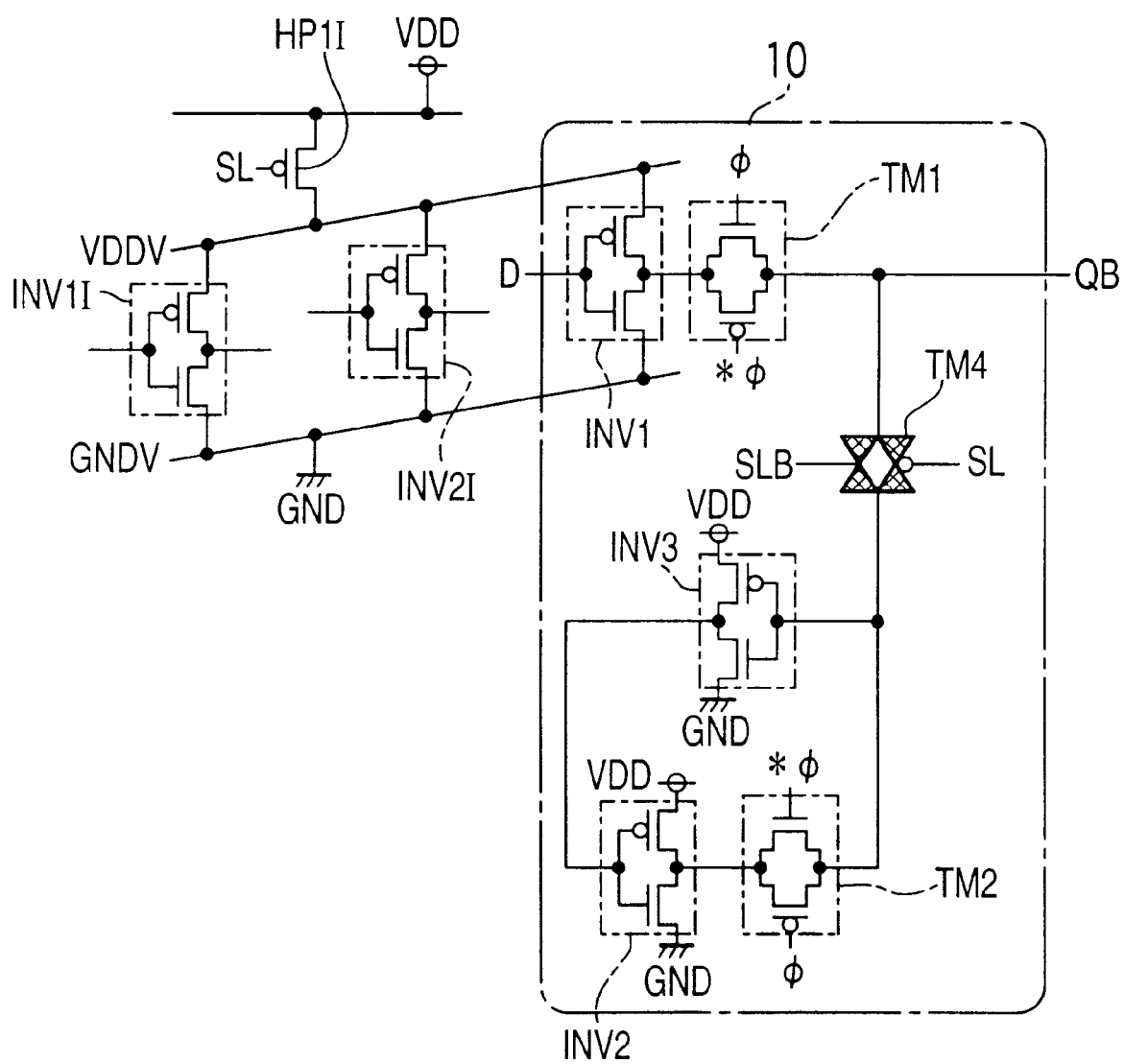
FIG. 10 is a circuit diagram of the sequential circuit which has a function of holding data in the sleep mode, according to an eighth embodiment of the present invention.

FIG. 10 is a circuit diagram of the semiconductor circuit with the sequential circuit which has a function of holding data in the sleep mode, according to the eighth embodiment of the present invention. Referring to FIG. 10, the semiconductor circuit in the eighth embodiment has substantially the same circuitry construction as that of the latch circuit 10 shown in FIG. 8. The eighth embodiment is different from the sixth embodiment in that the output signal is specified by QB as the data signal D has been supplied and the inverter circuit INV1 is connected to directly the lower potential side actual power supply line GND.

Figure 11:
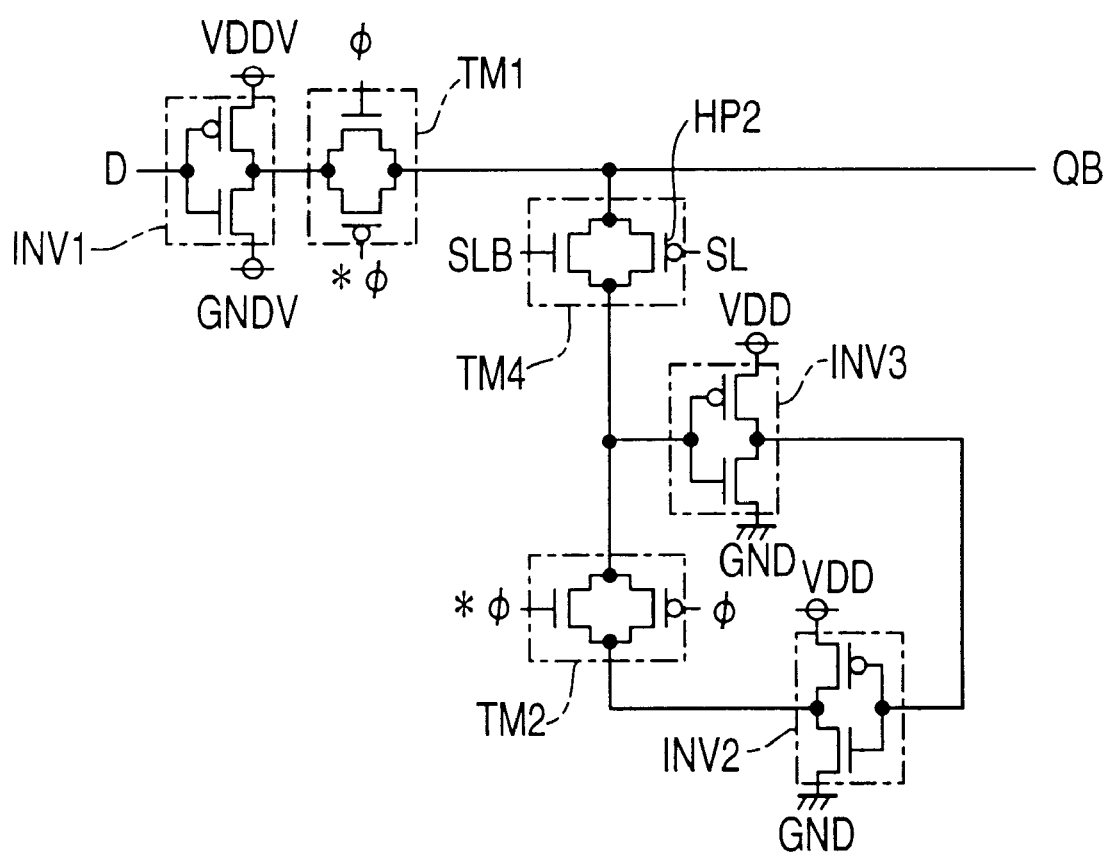
FIG. 11 is a circuit diagram of the sequential circuit which has a function of holding data in the sleep mode, according to a ninth embodiment of the present invention.

FIG. 11 is a circuit diagram of the sequential circuit which has a function of holding data in the sleep mode, according to the ninth embodiment of the present invention. Referring to FIG. 11, the sequential circuit in the ninth embodiment has substantially the same circuitry construction as that of the latch circuit 10 in the sixth embodiment shown in FIG. 8. The ninth embodiment is different from the sixth embodiment in that a combination of transistors are used for the transfer gate TM4 in the latch circuit 10 in the sixth embodiment shown in FIG. 8.

Figure 12:
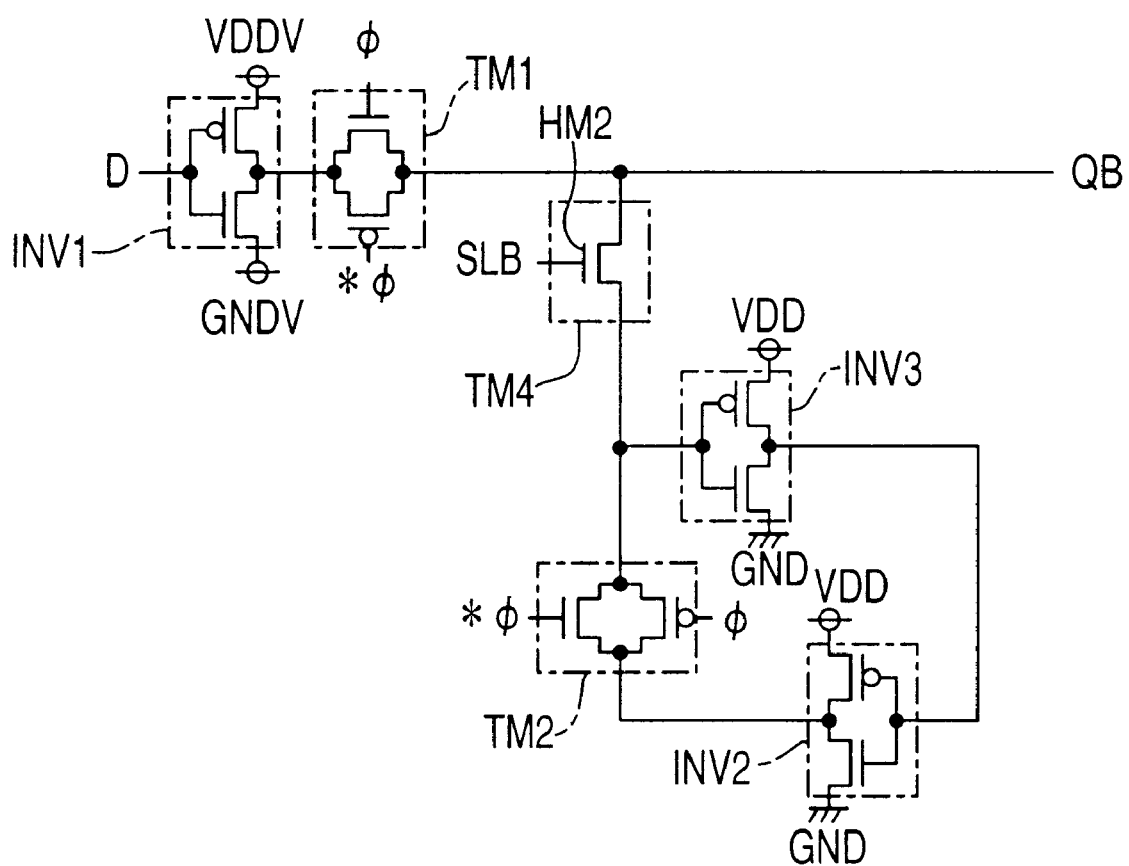
FIG. 12 is a circuit diagram of the sequential circuit which has a function of holding data in the sleep mode, according to a tenth embodiment of the present invention.

FIG. 12 is a circuit diagram of the sequential circuit which has a function of holding data in the sleep mode, according to the tenth embodiment of the present invention. Referring to FIG. 12, the sequential circuit in tenth embodiment has substantially the same circuitry construction as that of the latch circuit 10 in the sixth embodiment shown in FIG. 8. The tenth embodiment is different from the sixth embodiment in that a single transistor is used for the transfer gate TM4 in the latch circuit 10 in the sixth embodiment shown in FIG. 8.

As set forth above, according to the present invention, the higher potential side quasi power supply line and/or the lower potential side quasi power supply line are used as the power supplies at the higher potential side and the lower potential side, respectively. Thus, the inverter circuits are energized which are essential components of the sequential circuit which has a function of holding data in the sleep mode. Accordingly, undesired currents due to the sub-threshold voltage leakage can be shut off in the sequential circuit.

Also, each of the higher threshold voltage switching elements required for shutting off the sub-threshold voltage leakage currents is implemented by a single circuitry device.

What is claimed is:

1. A semiconductor circuit comprising a logic circuit section and a latch circuit section, wherein said logic circuit section includes:

higher and lower potential side actual power supply lines;

higher and lower potential side quasi power supply lines;

a CMOS logic circuit connected between said higher and lower potential side quasi power supply lines and composed of MOS transistors having a first threshold voltage; and a power connection section which connects at least one of said higher and lower potential side actual power supply lines to a corresponding one of said higher and lower potential side quasi power supply lines, a remaining one of said higher and lower potential side actual power supply lines being directly connected to a corresponding one of said higher and lower potential side quasi power supply lines, wherein said power connection section includes at least one control MOS transistor having a second threshold voltage higher than said first threshold voltage, wherein said latch circuit section includes:

a first CMOS inverter connected between said higher and lower potential side quasi power supply lines;

a latch circuit operatively and selectively connected to said first CMOS inverter in series and composed of second and third CMOS inverters connected in series; and a transfer gate having said second threshold voltage and disposed between said first CMOS inverter and said latch circuit.

2. The semiconductor circuit according to claim 1, wherein said power connection section includes a first control MOS transistor disposed between said higher potential side actual power supply line and said higher potential side quasi power supply line, wherein said lower potential side actual power supply line is directly connected to said lower potential side quasi power supply line.

3. The semiconductor circuit according to claim 2, wherein said power connection section is controlled in response to a signal indicating a sleep mode.

4. The semiconductor circuit according to claim 1, wherein said power connection section includes a second control MOS transistor disposed between said lower potential side actual power supply line and said lower potential side quasi power supply line, wherein said higher potential side actual power supply line is directly connected to said higher potential side quasi power supply line.

5. The semiconductor circuit according to claim 4, wherein said power connection section is controlled in response to an inverted signal of a signal indicating a sleep mode.

6. The semiconductor circuit according to claim 1, wherein said power connection section includes:

a first control MOS transistor disposed between said higher potential side actual power supply line and said higher potential side quasi power supply line; and a second control MOS transistor disposed between said lower potential side actual power supply line and said lower potential side quasi power supply line.

7. The semiconductor circuit according to claim 6, wherein said power connection section is controlled in response to a signal indicating a sleep mode and an inverted signal of said sleep mode indicating signal.

8. The semiconductor circuit according to claim 1, wherein said latch circuit section further includes a first transfer gate connected between an output terminal of said latch circuit section and said transfer gate, wherein said latch circuit connected to said output terminal.

9. The semiconductor circuit according to claim 1, wherein said latch circuit section further includes a first transfer gate connected between said first CMOS inverter and said transfer gate, wherein a node between said transfer gate and said latch circuit is connected to said output terminal of said latch circuit section.

10. The semiconductor circuit according to claim 1, wherein said transfer gate includes a single unit device.

11. The semiconductor circuit according to claim 10, wherein said transfer gate is controlled in response to a signal indicating a sleep mode and an inverted signal of said sleep mode indicating signal.

12. The semiconductor circuit according to claim 1, wherein said transfer gate includes a high threshold voltage p-channel MOS transistor and a high threshold voltage n-channel MOS transistor which are connected in parallel.

13. The semiconductor circuit according to claim 12, wherein said transfer gate is controlled in response to a signal indicating a sleep mode and an inverted signal of said sleep mode indicating signal.

14. The semiconductor circuit according to claim 1, wherein said transfer gate includes a high threshold voltage n-channel MOS transistor.

15. The semiconductor circuit according to claim 14, wherein said transfer gate is controlled in response to an inverted signal of a signal indicating a sleep mode.

16. The semiconductor circuit according to claim 15, wherein a level of the inverted signal is equal to a sum of a voltage on said higher potential side quasi power supply line and said second threshold voltage.

17. A sequential circuit comprising:

higher and lower potential side actual power supply lines;

higher and lower potential side quasi power supply lines;

a power connection section which connects at least one of said higher and lower potential side actual power supply lines to a corresponding one of said higher and lower potential side quasi power supply lines, a remaining one of said higher and lower potential side actual power supply lines being directly connected to a corresponding one of said higher and lower potential side quasi power supply lines, wherein said power connection section includes at least one control MOS transistor having a second threshold voltage higher than a first threshold voltage, a first CMOS inverter connected between said higher and lower potential side quasi power supply lines, said CMOS inverter including a MOS transistor having said first threshold voltage;

a latch circuit operatively and selectively connected to said first CMOS inverter in series and composed of second and third CMOS inverters connected in series; and a transfer gate having said second threshold voltage and disposed between said first CMOS inverter and said latch circuit.

18. The sequential circuit according to claim 17, wherein said power connection section includes a first control MOS transistor disposed between said higher potential side actual power supply line and said higher potential side quasi power supply line, wherein said lower potential side actual power supply line is directly connected to said lower potential side quasi power supply line.

19. The sequential circuit according to claim 18, wherein said power connection section is controlled in response to a signal indicating a sleep mode.

20. The sequential circuit according to claim 17, wherein said power connection section includes a second control MOS transistor disposed between said lower potential side actual power supply line and said lower potential side quasi power supply line, wherein said higher potential side actual power supply line is directly connected to said higher potential side quasi power supply line.

21. The sequential circuit according to claim 20, wherein said power connection section is controlled in response to an inverted signal of a signal indicating a sleep mode.

22. The sequential circuit according to claim 17, wherein said power connection section includes:

a first control MOS transistor disposed between said higher potential side actual power supply line and said higher potential side quasi power supply line; and a second control MOS transistor disposed between said lower potential side actual power supply line and said lower potential side quasi power supply line.

23. The sequential circuit according to claim 22, wherein said power connection section is controlled in response to a signal indicating a sleep mode and an inverted signal of said sleep mode indicating signal.

24. The sequential circuit according to claim 17, wherein said latch circuit section further includes a first transfer gate connected between an output terminal of said latch circuit section and said transfer gate, wherein said latch circuit connected to said output terminal.

25. The sequential circuit according to claim 17, wherein said latch circuit section further includes a first transfer gate connected between said first CMOS inverter and said transfer gate, wherein a node between said transfer gate and said latch circuit is connected to said output terminal of said latch circuit section.

26. The sequential circuit according to claim 17, wherein said transfer gate includes a single unit device.

27. The sequential circuit according to claim 26, wherein said transfer gate is controlled in response to a signal indicating a sleep mode and an inverted signal of said sleep mode indicating signal.

28. The sequential circuit according to claim 17, wherein said transfer gate includes a high threshold voltage p-channel MOS transistor and a high threshold voltage n-channel MOS transistor which are connected in parallel.

29. The sequential circuit according to claim 28, wherein said transfer gate is controlled in response to a signal indicating a sleep mode and an inverted signal of said sleep mode indicating signal.

30. The sequential circuit according to claim 17, wherein said transfer gate includes a high threshold voltage n-channel MOS transistor.

31. The sequential circuit according to claim 30, wherein said transfer gate is controlled in response to an inverted signal of a signal indicating a sleep mode.

32. The sequential circuit according to claim 31, wherein a level of the inverted signal is equal to a sum of a voltage on said higher potential side quasi power supply line and said second threshold voltage.

* * * * *